United States Patent
Wu et al.

(10) Patent No.: US 9,153,621 B2
(45) Date of Patent: Oct. 6, 2015

(54) PROCESS OF FORMING A BACK SIDE ILLUMINATION IMAGE SENSOR

(71) Applicant: HIMAX IMAGING, INC., Grand Cayman (KY)

(72) Inventors: Yang Wu, Tainan County (TW); Inna Patrick, Tainan County (TW)

(73) Assignee: Himax Imaging, Inc., Grand Cayman (KY)

( * ) Notice: Subject to any disclaimer, the term of this patent is extended or adjusted under 35 U.S.C. 154(b) by 0 days.

(21) Appl. No.: 14/475,362

(22) Filed: Sep. 2, 2014

(65) Prior Publication Data

US 2014/0370642 A1  Dec. 18, 2014

Related U.S. Application Data

(63) Continuation-in-part of application No. 13/479,189, filed on May 23, 2012.

(51) Int. Cl.
*H01L 27/146* (2006.01)

(52) U.S. Cl.
CPC ...... *H01L 27/14689* (2013.01); *H01L 27/1464* (2013.01); *H01L 27/14616* (2013.01); *H01L 27/14614* (2013.01); *H01L 27/14643* (2013.01)

(58) Field of Classification Search
CPC ............. H01L 27/1461; H01L 27/14806; H01L 27/14616; H01L 27/1464; H01L 27/14689; H01L 27/14614; H01L 27/14643
See application file for complete search history.

(56) References Cited

U.S. PATENT DOCUMENTS

| | | | |
|---|---|---|---|
| 5,476,808 A * | 12/1995 | Kusaka et al. | 438/75 |
| 6,136,629 A | 10/2000 | Sin | |
| 6,504,193 B1 | 1/2003 | Ishiwata et al. | |
| 7,214,974 B2 | 5/2007 | Shin | |
| 7,253,019 B2 * | 8/2007 | Dierickx | 438/60 |
| 7,348,613 B2 | 3/2008 | Rhodes | |
| 2003/0086011 A1 * | 5/2003 | Wu et al. | 348/308 |
| 2003/0209712 A1 | 11/2003 | Fujita et al. | |
| 2006/0141661 A1 * | 6/2006 | Park et al. | 438/75 |
| 2006/0273355 A1 * | 12/2006 | Han | 257/239 |
| 2007/0023800 A1 | 2/2007 | Ohkawa | |
| 2007/0069322 A1 | 3/2007 | Jeon | |
| 2007/0075337 A1 | 4/2007 | Jung et al. | |
| 2008/0081393 A1 | 4/2008 | Park et al. | |
| 2009/0166690 A1 | 7/2009 | Kim | |
| 2009/0166693 A1 | 7/2009 | Kim | |
| 2011/0121371 A1 * | 5/2011 | Sakano et al. | 257/292 |
| 2012/0037967 A1 * | 2/2012 | Adkisson et al. | 257/292 |
| 2013/0009224 A1 * | 1/2013 | Ohri | 257/292 |
| 2013/0049155 A1 * | 2/2013 | Roy et al. | 257/443 |

\* cited by examiner

*Primary Examiner* — William F Kraig
*Assistant Examiner* — Latanya N Crawford
(74) *Attorney, Agent, or Firm* — Donald E. Stout; Stout, Uxa & Buyan, LLP

(57) ABSTRACT

A process of forming a back side illumination (BSI) image sensor is disclosed. An n-type implant is formed in a semiconductor substrate, and a p-type implant region, surrounding n-type in each pixel, is formed in the n-type implant such that in cross sectional view an n-type implant region is sandwiched between the two p-type implant regions. A transfer gate is formed on the semiconductor substrate such that the transfer gate entirely covers the n-type implant region and at least partially covers each of the p-type implant regions. A floating diffusion is formed in one of the p-type implant regions.

9 Claims, 9 Drawing Sheets

PROCESS OF FORMING A BACK SIDE ILLUMINATION IMAGE SENSOR

CROSS-REFERENCE TO RELATED APPLICATIONS

This application is a continuation-in-part of U.S. application Ser. No. 13/479,189, filed on May 23, 2012 and entitled BACK SIDE ILLUMINATION IMAGE SENSOR AND A PROCESS THEREOF, which is a divisional of U.S. application Ser. No. 12/795,256 (now U.S. Pat. No. 8,237,207), filed on Jun. 7, 2010 and entitled BACK SIDE ILLUMINATION IMAGE SENSOR AND A PROCESS THEREOF, which claims the benefit of U.S. Provisional Application No. 61/294,398, filed on Jan. 12, 2010 and entitled Non-self aligned Back side illumination (BSI) CMOS image sensor with an extended transfer gate Poly, the entire contents of which are hereby incorporated by reference.

BACKGROUND OF THE INVENTION

1. Field of the Invention

The present invention generally relates to an image sensor, and more particularly to a process and structure of a non-self aligned back side illumination (BSI) CMOS image sensor.

2. Description of Related Art

The pixel size of a complementary metal oxide semiconductor (CMOS) image sensor (CIS) becomes smaller than ever to meet high resolution and low form factor (or physical dimensions) requirement, for example, for mobile devices. FIG. 1A shows a cross sectional view of a conventional photodiode along with a portion of a pixel circuit. The front side of silicon wafer receives light, and this type of CIS is commonly called the front side illumination (FSI) CIS. As the p-type implant 10 and the n-type implant 12 of the photodiode are masked defined, this type of FSI CIS is thus called the non-self aligned (non-SA) FSI CIS. One of the disadvantages of the non-SA FSI CIS is the overlap issue, in which the first overlap 100 between the p-type implant 10 and the transfer gate (Tx) 14 and the second overlap 120 between the n-type implant 12 and the transfer gate 14 cannot be precisely controlled. Specifically, the first overlap 100 provides low leakage dark current when the transfer gate 14 is off, and the second overlap 120 provides smooth charge transfer when the transfer gate 14 is on. FIG. 1B exemplifies a non-SA FSI CIS with narrow second overlap 120 due to misalignment 122. Accordingly, the performance of the pixels in the non-SA FSI CIS varies tremendously from column to column, wafer to wafer, and lot to lot.

FIG. 1C shows a cross sectional view of another conventional FSI CIS. The p-type implant 10 and the n-type implant 12 are aligned with the transfer gate 14, which is used as a mask, and this type of FSI CIS is thus called the self aligned (SA) FSI CIS. Compared to the non-SA FSI CIS (FIG. 1A), the SA FSI CIS may achieve consistent performance. However, it is difficult to have a large margin on the second overlap 120 between the n-type implant 12 and the transfer gate 14 due to some design constrains such as the photodiode depth, shape, blue response or transfer gate height. Accordingly, the tiny second overlap 120 may be easily affected by other implants, particularly when the pixel size is very small, thereby complicating the process optimization.

In order to solve the overlap issue discussed above, there are some schemes disclosed to make the second overlap 120 between the n-type implant 12 and the transfer gate 14 sufficiently large so that the overlap variation becomes relatively small or/and the performance of the transfer gate 14 does not change due to overlap variation. FIG. 2A shows a cross sectional view of a conventional FSI CIS before applying the schemes, FIG. 2B shows a cross sectional view of a FSI CIS after applying the first scheme, and FIG. 2C shows a cross sectional view of a FSI CIS after applying the second scheme.

In the first scheme, as shown in FIG. 2B which is to be compared to FIG. 2A, the transfer gate 14 is kept unchanged, but the edge of the n-type implant 12 is extended into the transfer gate 14 area toward the floating diffusion (FD) 16. However, according to this scheme, the effective transfer gate length 140 becomes shorter, thereby increasing leakage current or even resulting in punch through between the n-type implant 12 and the floating diffusion 16.

In the second scheme, as shown in FIG. 2C which is to be compared to FIG. 2A, the n-type implant 12 is kept unchanged, but the edge of the transfer gate 14 is extended toward the photodiode (i.e., the p-type implant 10 and the n-type implant 12). However, according to this scheme, the effective area (or optical fill factor) for receiving incoming light becomes smaller, thereby degrading quantum efficiency (QE).

For the reason that conventional CIS, either non-SA FSI CIS or SA FSI CIS, could not effectively solve the overlap issue, a need has arisen to propose a novel CIS that has better performance than the conventional CIS.

SUMMARY OF THE INVENTION

In view of the foregoing, it is an object of the embodiment of the present invention to provide a process and structure of a non-SA back side illumination (BSI) CMOS image sensor (CIS) that may increase the overlap between the n-type implant and the transfer gate. In one embodiment, an extended transfer gate is formed to improve hole accumulation with off transfer gate, thereby reducing surface dark current. Moreover, if non-SA BSI CIS is applied to the advanced three dimensional (3D) CIS structure, the coupling capacitance between a transfer-gate via and a floating-diffusion via may be substantially reduced, thereby reducing the coupling capacitance between them and thus increasing conversion gain. Further, BSI red response may be boosted by forming reflection layers by the extended transfer gate poly on top of PD.

According to one embodiment, an n-type doped region is formed in a semiconductor substrate, and a transfer gate is formed on the semiconductor substrate, therefore resulting in an overlap between one end of the transfer gate and the n-type doped region. A p-type doped region is then formed in the n-type doped region using the transfer gate as a mask.

According to another embodiment, an n-type doped region is formed in a semiconductor substrate, and a p-type doped region is formed in the n-type doped region. A transfer gate is then formed on the semiconductor substrate to substantially cover the n-type doped region and the p-type doped region.

According to a further embodiment, an n-type implant is formed in a semiconductor substrate, the n-type implant including an n-type implant region. A p-type implant region, that surrounds n-type in each pixel, is formed in the n-type implant such that in a cross sectional view the n-type implant region is sandwiched between the two p-type implant regions. A transfer gate is formed on the semiconductor substrate such that the transfer gate entirely covers the n-type implant region and at least partially covers each of the p-type implant regions. A floating diffusion is formed in one of the p-type implant regions.

DETAILED DESCRIPTION OF THE INVENTION

FIG. 3A to FIG. 3D show a sequence of cross sectional views that illustrates a process of forming a non-self aligned (non-SA) back side illumination (BSI) complementary metal oxide semiconductor (CMOS) image sensor (CIS) according to a first embodiment of the present invention. It is noted that only layers or regions that are pertinent to the feature or features of the embodiment are discussed or shown. In other words, there may be further layer(s) or region(s) disposed between, on, below or adjacent to the shown layers or regions.

Figure 3A:
FIG. 3A to FIG. 3D show a sequence of cross sectional views that illustrates a process of forming a non-SA back side illumination (BSI) CIS according to a first embodiment of the present invention.
Figure 3B:
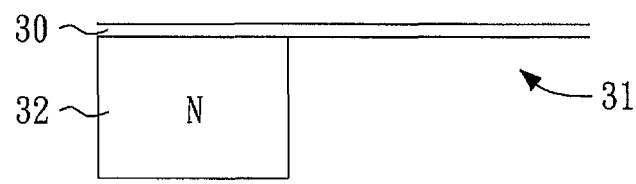
Figure 3C:
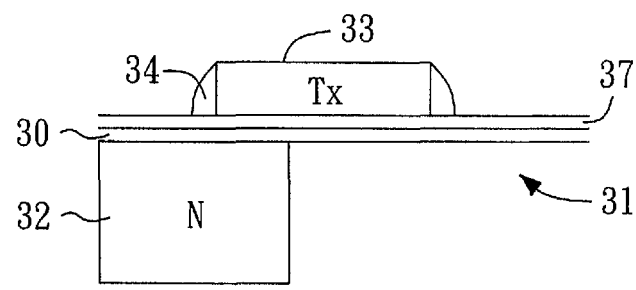
Figure 3D:
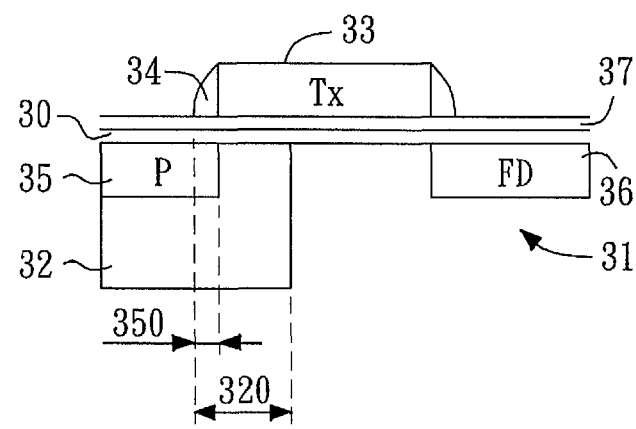

In FIG. 3A, all implants are within the top P type epitaxy portion of a semiconductor substrate 31 (e.g., a silicon substrate). A transfer gate (Tx) channel implant 30 such as p-type implant is formed in the semiconductor substrate 31. Subsequently, in FIG. 3B, an n-type doped region such as an n-type implant 32 is formed below the transfer gate channel implant 30. Next, in FIG. 3C, a thin gate oxide 37 is grown on the surface of substrate 31 and a transfer gate (Tx) 33 such as a polysilicon gate is formed on top of the gate oxide 37 such that an overlap exists between one end of the transfer gate 33 and the n-type implant 32. A spacer 34 such as silicon dioxide or silicon nitride may be further formed on a sidewall of the transfer gate 33. Afterwards, in FIG. 3D, a p-type doped region such as a p-type implant 35 is formed in the n-type implant 32 using the transfer gate 33 and the spacer 34 as a mask. In addition, a floating diffusion (FD) 36 is also formed in the substrate 31 near the other end of the transfer gate 33. The n-type implant 32 is disposed away from the floating diffusion 36. It is appreciated that some of the steps described above may be performed in an order other than that depicted in the figure. For example, the p-type implant 35 may be formed prior to the spacer 34 formation.

In the process described above, as the n-type implant 32 is non-self aligned with the transfer gate 33 and the back side of the substrate 31 receives incoming light, this type of CIS is thus called the non-SA back side illumination (BSI) CIS.

Figure 2A:
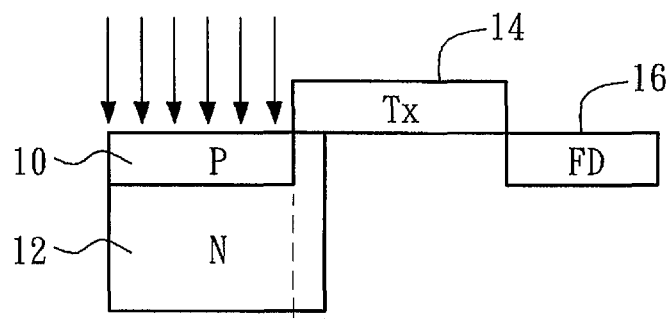
FIG. 2A shows a cross sectional view of a conventional FSI CIS before applying the conventional schemes.
Figure 2B:
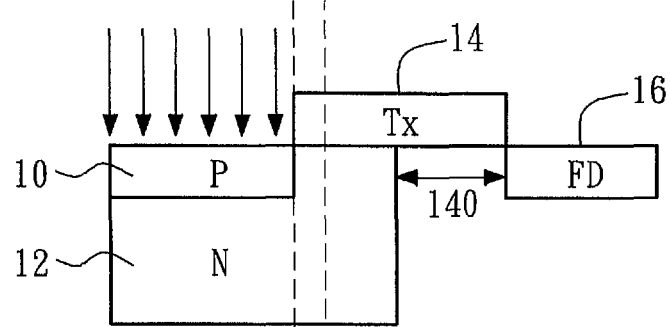
FIG. 2B shows a cross sectional view of a FSI CIS after applying the first conventional scheme.
Figure 2C:
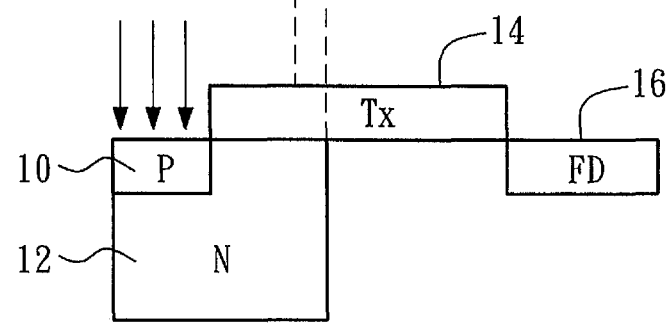
FIG. 2C shows a cross sectional view of a FSI CIS after applying the second conventional scheme.
Figure 4A:
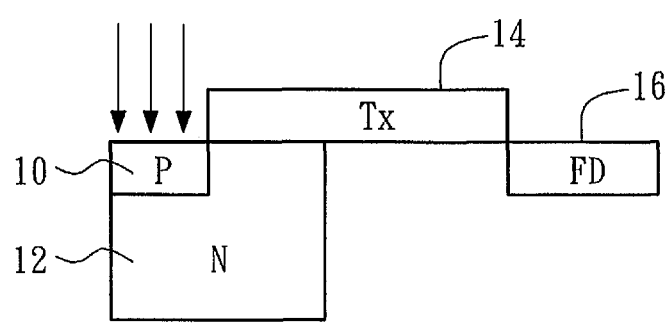
FIG. 4A shows a cross sectional view of a FSI CIS with extended transfer gate of the present invention.
Figure 4B:
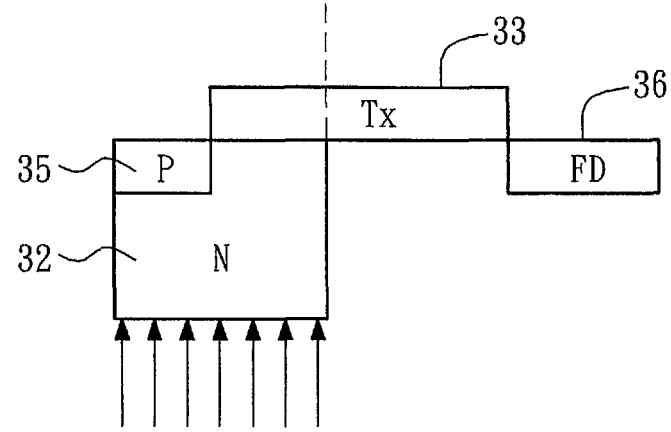
FIG. 4B shows a cross sectional view of a non-SA BSI CIS according to the first embodiment of the present invention.

According to the first embodiment, the incoming light is from the substrate backside, unlike the same structure on FSI in FIG. 2C (which is now reproduced in FIG. 4A), extended Tx Poly does not reduce the optical fill factor. Thanks to the extended Poly according to the present embodiment (FIG. 4B), more space on the top surface of the substrate 31 is available for obtaining large overlap 320 between the n-type implant 32 and the transfer gate 33, thereby improving charge transfer. In addition, overlap variation due to process misalignment becomes less significant. Moreover, the transfer gate 33 is less sensitive to the lateral diffusion 350 of the p-type implant 35 toward the transfer gate 33. This, therefore, provides more flexibility on p-type implant 35 and other implants optimizations.

FIG. 5A to FIG. 5D show a sequence of cross sectional views that illustrates a process of forming a non-self aligned (non-SA) BSI CIS according to a second embodiment of the present invention. In the second embodiment, both the n-type implant 32 and the p-type implant 35 are non-self aligned (non-SA) with the transfer gate 33, while, in the first embodiment, only the n-type implant 32 is non-self aligned (non-SA) with the transfer gate 33.

Figure 5A:
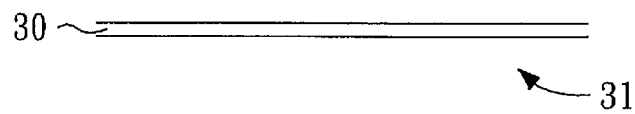
FIG. 5A to FIG. 5D show a sequence of cross sectional views that illustrates a process of forming a non-SA BSI CIS according to a second embodiment of the present invention.
Figure 5B:
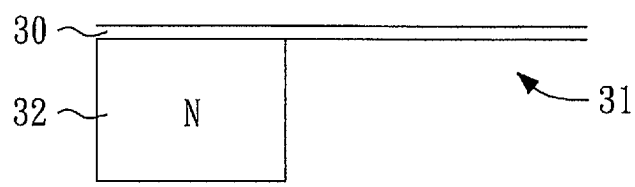
Figure 5C:
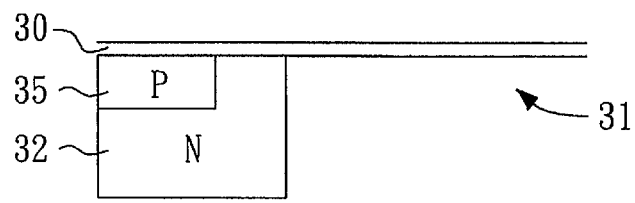
Figure 5D:
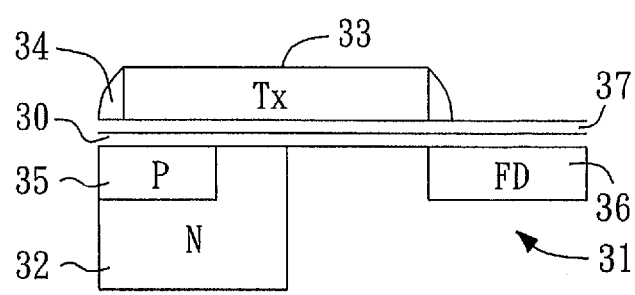

In FIG. 5A, all implants are within the top P type epitaxy portion of a semiconductor substrate 31 (e.g., a silicon substrate). A transfer gate (Tx) channel implant 30 such as p-type implant is formed in a semiconductor substrate 31. Subsequently, in FIG. 5B, an n-type doped region such as an n-type implant 32 is formed below the transfer gate channel implant 30. Next, in FIG. 5C, a p-type doped region such as a p-type implant 35 is formed in the n-type implant 32. Accordingly, at the surface region of the substrate 31, sufficient distance is created between the n-type implant 32 and the p-type implant 35. Afterwards, in FIG. 5D, a thin gate oxide 37 is grown on the surface of substrate 31 and then a transfer gate (Tx) 33 such as a polysilicon gate is formed on top of the gate oxide 37 such that an overlap exists between the transfer gate 33 and the n-type implant 32. Further, the transfer gate 33 is extended to substantially (e.g., more than 95%) cover the photodiode (i.e., the p-type implant 35 and the n-type implant 32). A spacer 34 such as silicon dioxide or silicon nitride may be further formed on a sidewall of the transfer gate 33. In addition, a floating diffusion (FD) 36 is also formed in the substrate 31.

The second embodiment maintains the advantages of the first embodiment. In addition, as the extended transfer gate 33 covers the photodiode (32 and 35) area in the second embodiment, hole accumulation with off transfer gate 33 not only occurs at the surface of substrate 31 between the photodiode (32 and 35) and the floating diffusion 36, but also occurs over the p-type implant 35, thereby further reducing surface dark current.

Figure 6A:
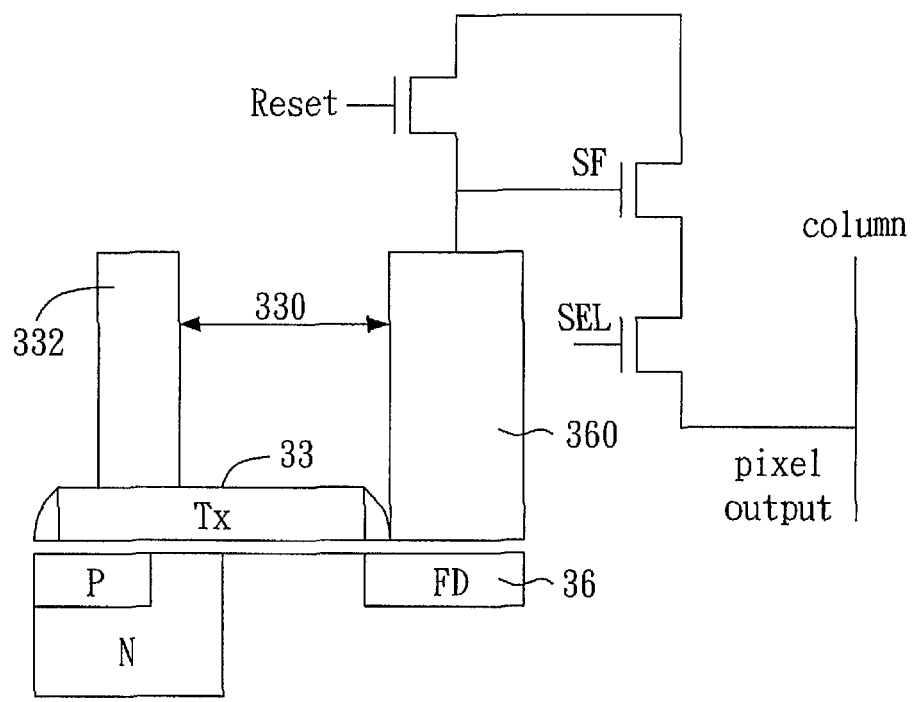
FIG. 6A shows a cross sectional view of the non-SA BSI CIS with extended transfer gate along with circuit schematic of a portion of the pixel circuit in the advanced 3D CIS technology of the present invention.
Figure 6B:
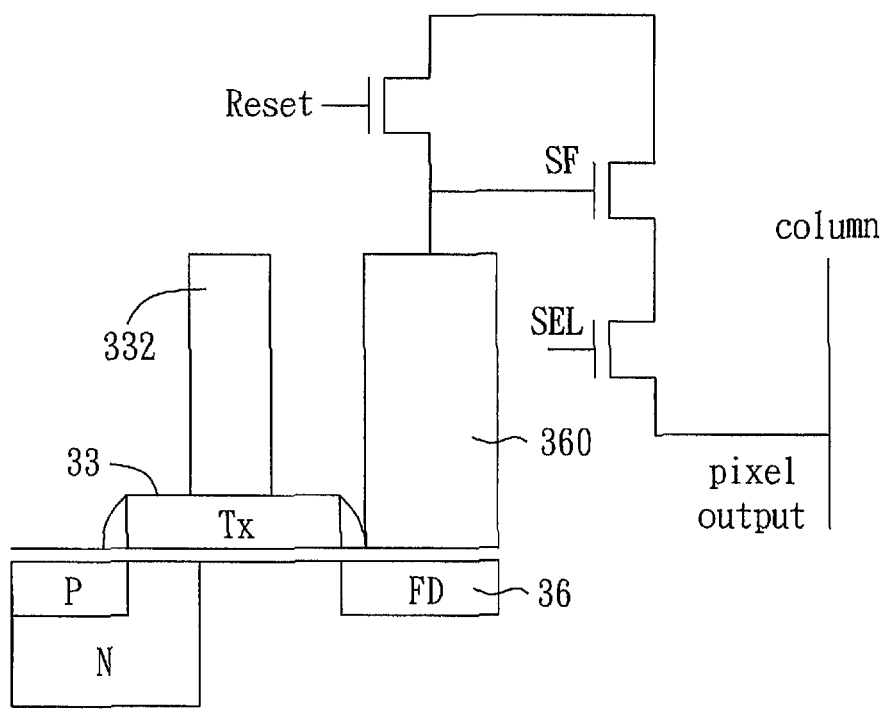
FIG. 6B shows a cross sectional view and circuit schematic of a counterpart of FIG. 6A without extended transfer gate.

Moreover, the non-SA BSI CSI second embodiment can also benefit the burgeoning 3D CIS technology. It is shown in FIG. 6A a cross sectional view of the non-SA BSI CIS with extended transfer gate 33 at the pixel photo diode level along with circuit schematic of a portion of the pixel circuit (e.g., a reset transistor, a source follower SF and a select transistor SEL) at the pixel circuit level and two 3D vias 360 and 332 at FD 36 and Tx 33 respectively bridging the PD and Circuit levels in the vertical direction (the added $3^{rd}$ dimension vs. the conventional 2D topology of Integrated Circuit). FIG. 6B shows a cross sectional view and circuit schematic of a counterpart without extended transfer gate. It is observed that the distance 330 between a transfer-gate 3D via 332 and a FD 3D via 360 may be substantially increased (compared to that shown in FIG. 6B), thereby reducing the coupling capacitance between them and thus increasing conversion gain.

Figure 7:
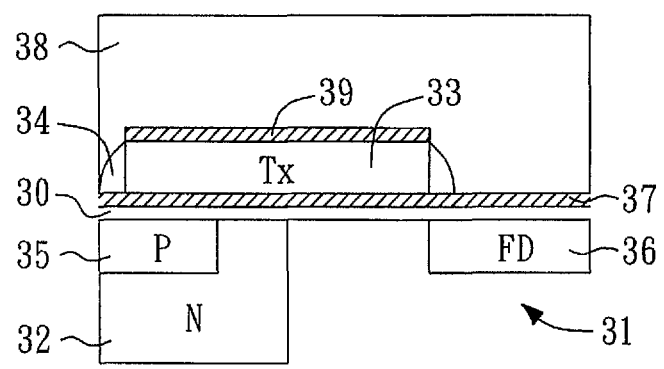
FIG. 7 shows a cross sectional view of the non-SA BSI CIS with extended transfer gate 33 according to one embodiment of the present invention.

The non-SA BSI CIS second embodiment also improves CIS optical performance. FIG. 7 shows a cross sectional view of the non-SA BSI CIS with extended transfer gate 33 according to the second embodiment in FIG. 5D of the present invention. As described earlier in the process, a gate oxide layer 37 is formed between the surface of the substrate 31 and the transfer gate 33. Also in the standard CMOS process, an inter-metal-dielectric (IMD) layer 38 is formed over the transfer gate 33 and the oxide layer 37. In the embodiment, the optical indices of the substrate 31, the oxide layer 37, the transfer gate 33 and the IMD layer 38 are chosen such that (1) the optical index of the substrate 31 (e.g., Si) is higher than the optical index of the oxide layer 37, thereby forming a first interface with index contrast; (2) the optical index of the transfer gate 33 (e.g., Poly Si) is higher than the optical index of the oxide layer 37, thereby forming a second interface with index contrast; (3) the optical index of the transfer gate 33 is higher than the optical index of the IMD layer 38, thereby forming a third interface with index contrast. In one example, the IMD layer 38 includes porous material that has even lower optical index. These three interfaces may produce more reflection of light, especially long wavelength red light back to the photodiode (32 and 35), thereby boosting red response. According to another embodiment, still referring to FIG. 7, a silicide reflector layer 39 is further formed between the transfer gate 33 and the IMD layer 38 to further boost red response.

FIG. 8A to FIG. 8F show a sequence of cross sectional views that illustrates a process of forming a non-self aligned (non-SA) back side illumination (BSI) CMOS image sensor (CIS) according to a third embodiment of the present invention.

Figure 8A:
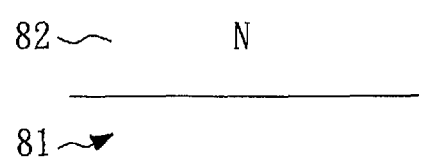
FIG. 8A to FIG. 8F show a sequence of cross sectional views that illustrates a process of forming a non-SA BSI CIS according to a third embodiment of the present invention.
Figure 8B:
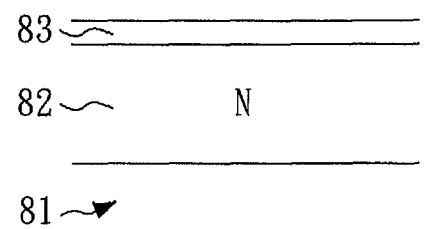
Figure 8C:
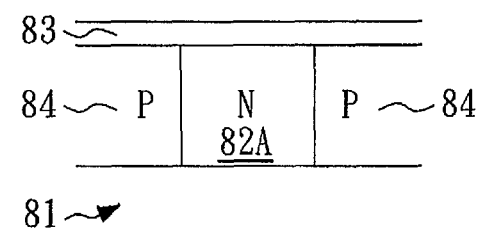
Figure 8D:
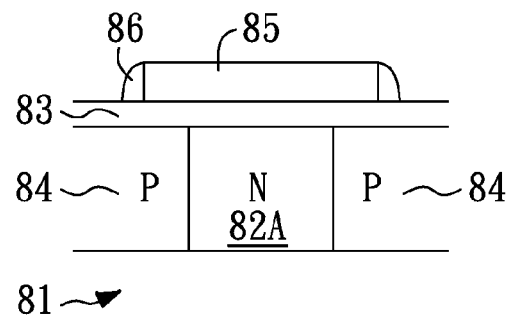
Figure 8E:
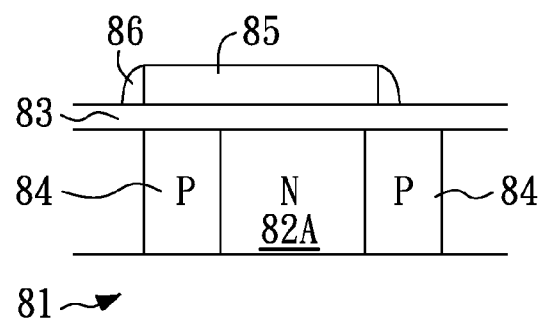
Figure 8F:
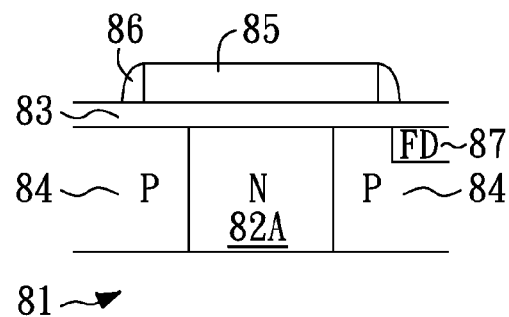

In FIG. 8A, a semiconductor substrate 81 (for example, a silicon substrate) is provided. An n-type implant 82 is then formed in a top portion of the semiconductor substrate 81, followed by annealing (or heat treatment), therefore resulting in a structure shown in FIG. 8A. Subsequently, in FIG. 8B, a transfer gate channel implant 83, such as a p-type implant, is formed in a top portion of the n-type implant 82. Next, as shown in FIG. 8C, p-type implant region 84, that surrounds n-type implant 82, is formed in the n-type implant 82 such that as seen in cross section an n-type implant region 82A is sandwiched between the two p-type implant regions 84. Afterwards, in FIG. 8D, a transfer gate 85, such as a polysilicon gate, is formed on top of the transfer gate channel implant 83 (or on the semiconductor substrate 81) such that the transfer gate 85 entirely covers the n-type implant region 82A, and at least partially covers each of the p-type implant regions 84. In one embodiment, the transfer gate 85 may entirely cover one p-type implant region 84 (e.g., the left one) As shown in FIG. 8E. A spacer 86 such as silicon dioxide or silicon nitride may be further formed on a sidewall of the transfer gate 85. Finally, in FIG. 8F, a floating diffusion (FD) 87 is formed in one p-type implant region 84 (e.g., the right one). The floating diffusion 87 may be formed by self-aligned with the transfer gate 85 when the spacer 86 is formed after the floating diffusion 87 or is even not formed at all. Alternatively, the floating diffusion 87 may be formed by self-aligned with the spacer 86 when the spacer 86 is formed before the floating diffusion 87.

Figure 1A:
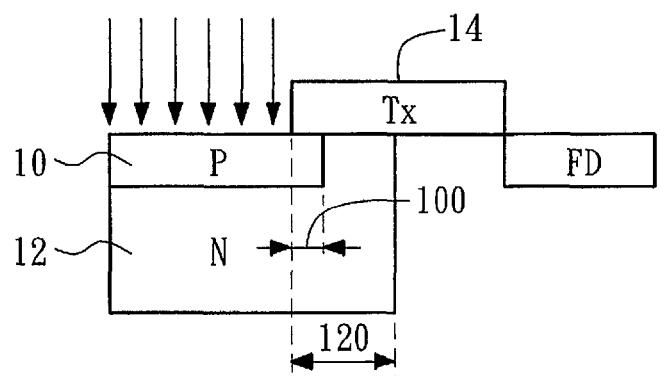
FIG. 1A shows a cross sectional view of a conventional photodiode along with a portion of a pixel circuit of a non-self aligned (non-SA) front side illumination (FSI) CMOS image sensor (CIS)
Figure 1B:
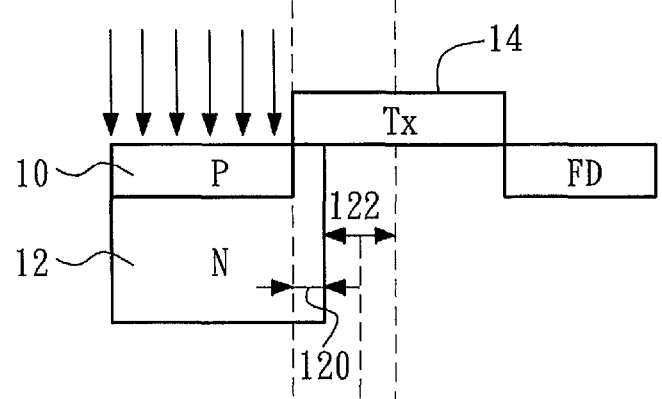
FIG. 1B exemplifies a conventional non-SA FSI CIS with narrow overlap due to misalignment.
Figure 1C:
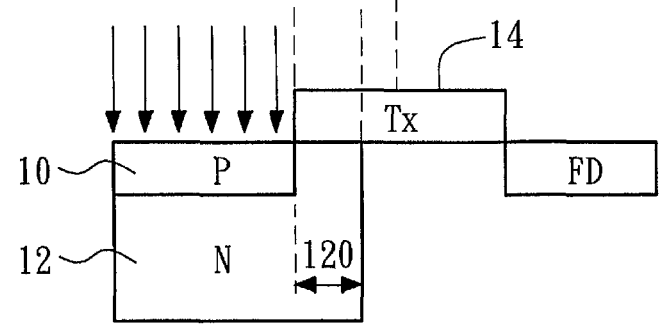
FIG. 1C shows a cross sectional view of a conventional self-aligned (SA) FSI CIS.

According to the third embodiment illustrated above, as the overlap between the n-type implant region 82A and the transfer gate 85 is sufficiently large so that charge transfer when the transfer gate 85 is on may be substantially improved, and uniform performance of the pixels in the non-SA BSI CIS may be achieved without misalignment issue encountered in conventional CIS as exemplified in FIG. 1B. As a result, the size of the transfer gate 85 may be reduced, and fill factor may be accordingly reduced. As stated earlier, the transfer gate 85 partially, or even entirely, covers one p-type implant region 84 (e.g., the left one), the overlap between the p-type implant region 84 and the transfer gate 85 may provide low leakage dark current when the transfer gate 85 is off.

The third embodiment may also maintain the advantages of the second embodiment illustrated in FIG. 5A to FIG. 5D concerning the extended transfer gate. Specifically speaking, as demonstrated in FIG. 6A, the distance 330 between a transfer-gate 3D via 332 and a FD 3D via 360 may be substantially increased, thereby reducing the coupling capacitance between them and thus increasing conversion gain.

Although specific embodiments have been illustrated and described, it will be appreciated by those skilled in the art that various modifications may be made without departing from the scope of the present invention, which is intended to be limited solely by the appended claims.

What is claimed is:

1. A process of forming a back side illumination (BSI) image sensor, comprising:
   forming an n-type implant in a semiconductor substrate, the n-type implant including an n-type implant region;
   forming a p-type implant region surrounding the n-type implant such that in cross sectional view the n-type implant region is sandwiched between the two p-type implant regions;
   forming a transfer gate on a front surface of the semiconductor substrate such that the transfer gate entirely covers the n-type implant region and at least partially covers each of the p-type implant regions;
   forming a floating diffusion in one of the p-type implant regions; and
   projecting light only on a back side of the semiconductor substrate;
   wherein the p-type implant region is formed after forming the n-type implant;
   wherein the transfer gate entirely covers one of the p-type implant regions.

2. The process of claim 1, after forming the n-type implant, further comprising a step of annealing the n-type implant.

3. The process of claim 1, before forming the two p-type implant regions, further comprising a step of forming a transfer gate channel implant in a top portion of the n-type implant.

4. The process of claim 3, wherein the transfer gate channel implant comprises a p-type implant.

5. The process of claim 1, wherein the transfer gate comprises a polysilicon gate.

6. The process of claim 1, further comprising a step of forming a spacer on a sidewall of the transfer gate.

7. The process of claim 6, wherein the floating diffusion is formed by self-aligned with the spacer.

8. The process of claim 1, wherein the floating diffusion is formed by self-aligned with the transfer gate.

9. The process of claim 1, wherein the image sensor comprises a complementary metal oxide semiconductor (CMOS) image sensor.

* * * * *